US006838358B2

(12) United States Patent
Maurice et al.

(10) Patent No.: US 6,838,358 B2
(45) Date of Patent: Jan. 4, 2005

(54) METHOD OF MANUFACTURING A WAFER (75) Inventors: Thibaut Maurice, Grenoble (FR); Ian Cayrefourcq, St. Nazaire les Eymes (FR); Franck Fournel, Moirans (FR)

(73) Assignee: S.O.I.TEC Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/716,900

(22) Filed: Nov. 18, 2003

(65) Prior Publication Data

US 2004/0241960 A1 Dec. 2, 2004

(30) Foreign Application Priority Data

May 26, 2003 (EP) ............................................. 03291252

(51) Int. Cl.$^7$ ............................................. H01L 21/30
(52) U.S. Cl. ..................................... 438/458; 438/459
(58) Field of Search .............................. 438/458, 459, 438/455, 463, 464

(56) References Cited

U.S. PATENT DOCUMENTS

| | | | | |
|---|---|---|---|---|
| 5,559,043 A | | 9/1996 | Bruel ........................ 438/407 |
| 5,877,070 A | | 3/1999 | Goesele et al. .............. 438/458 |
| 6,020,252 A | | 2/2000 | Aspar et al. ................. 438/458 |
| 6,054,363 A | | 4/2000 | Sakaguchi et al. .......... 438/406 |
| 6,071,795 A | | 6/2000 | Cheung et al. .............. 438/458 |
| 6,140,210 A | * | 10/2000 | Aga et al. .................... 438/458 |
| 6,150,239 A | | 11/2000 | Goesele et al. .............. 438/458 |
| 6,290,804 B1 | * | 9/2001 | Henley et al. ............... 156/344 |
| 6,335,258 B1 | | 1/2002 | Aspar et al. ................. 438/406 |
| 6,335,263 B1 | * | 1/2002 | Cheung et al. .............. 438/455 |
| 6,420,242 B1 | | 7/2002 | Cheung et al. .............. 438/458 |
| 6,511,899 B1 | * | 1/2003 | Henley et al. ............... 438/515 |
| 6,566,233 B2 | * | 5/2003 | Yokokawa et al. .......... 438/455 |
| 6,589,857 B2 | * | 7/2003 | Ogawa et al. ............... 438/502 |
| 6,700,631 B1 | * | 3/2004 | Inoue et al. ................... 349/45 |
| 2003/0162367 A1 | | 8/2003 | Roche .......................... 438/460 |

FOREIGN PATENT DOCUMENTS

| | | |
|---|---|---|
| EP | 0 843 346 A2 | 5/1998 |
| EP | 0 977 2426 A2 | 2/2000 |
| FR | 2 681 472 | 3/1993 |
| FR | 2 748 851 | 5/1996 |
| FR | 2 755 537 | 11/1996 |
| WO | WO/0180308 | 10/2001 |

* cited by examiner

*Primary Examiner*—Matthew Smith
*Assistant Examiner*—Lex H. Malsawma
(74) *Attorney, Agent, or Firm*—Winston & Strawn LLP (57) ABSTRACT

The present invention relates to a method of manufacturing a wafer in which a heterogeneous material compound is detached at a pre-determined detachment area of the compound, and the compound is subject to a thermal treatment. It is the object of the present invention to provide an easy and effective method of detachment a heterogeneous material compound with a reduced risk of an undefined breaking of the compound. The object is solved by a method wherein the thermal treatment includes annealing the compound, where the annealing is stopped before a detachment of the compound, and an irradiation of the compound with photons in order to obtain a detachment of the compound at the pre-determined detachment area.

24 Claims, 8 Drawing Sheets

METHOD OF MANUFACTURING A WAFER

BACKGROUND

1. Field of the Invention

The present invention relates to a method of manufacturing a wafer, in which a heterogeneous material compound is detached at a pre-determined detachment area of the compound, and the compound is subject to a thermal treatment.

2. Background of the Invention

Heterogeneous material compounds or heterostructures having a thin layer attached to a receiver substrate with a different thermal expansion coefficient have attained considerable industry attention in the fields of microelectronics, optoelectronics and micromechanics. Such structures can be fabricated using deposition processes based on electroplating, evaporation, spinning, etc. In other approaches, a bulk material is bonded to a receiver substrate and thereafter thinned down, either by a chemical mechanical polishing or by etching of the material. These methods mostly have a very low efficiency due to a lot of process steps and the resulting structures often cannot be produced with the required quality.

U.S. Pat. No. 5,877,070 discloses a method of manufacturing a wafer of the above-mentioned type. This method uses a modified variant of the well known SMARTCUT® process to transfer a thin film onto a hetero-substrate. Characteristic steps of this process are schematically shown in FIGS. 18a to 18c.

Figure 18:
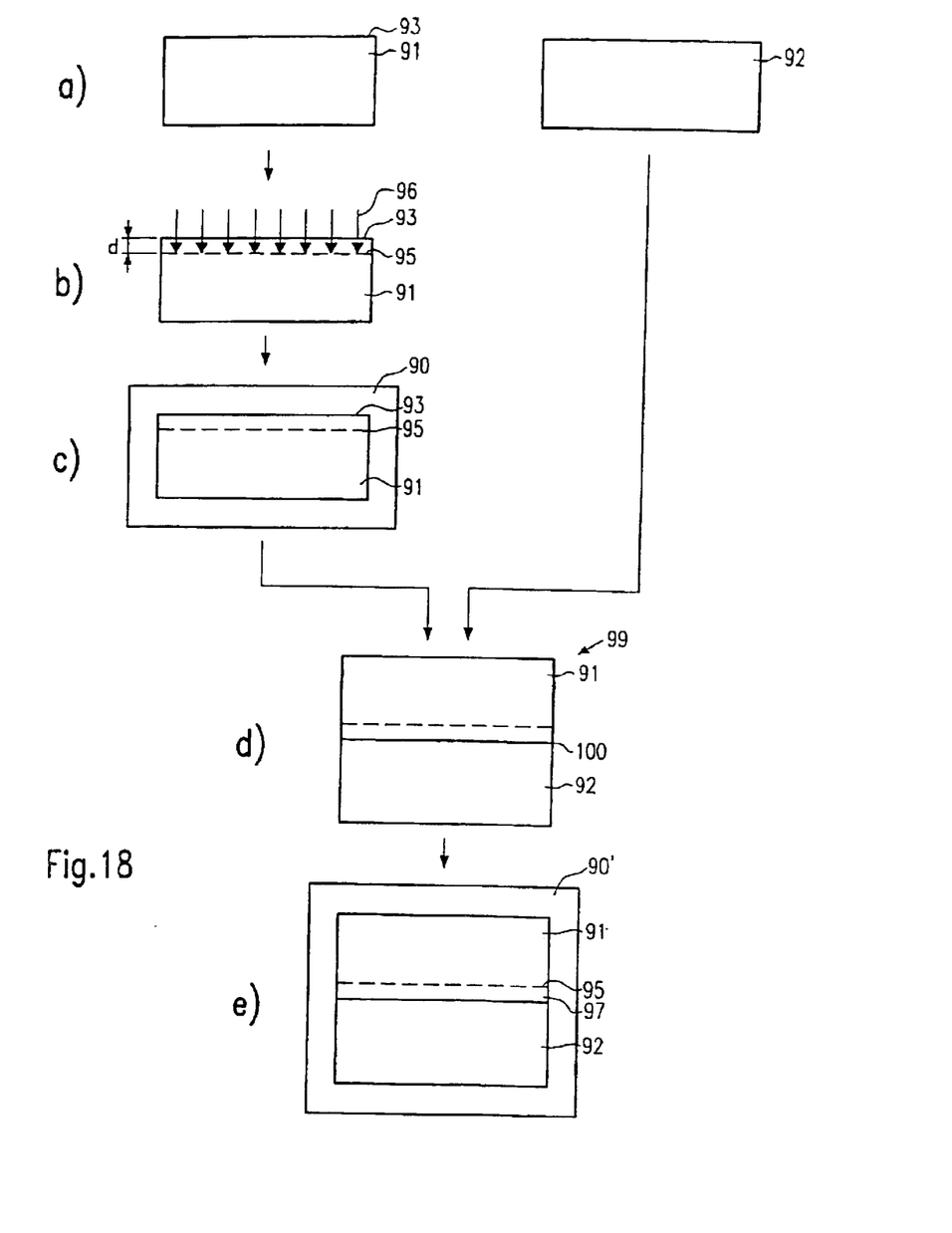
FIGS. 18(a)–18(e) schematically shows a prior art technique for manufacturing a wafer, in which a heterogeneous material compound is detached.

As shown in FIG. 18a, a donor wafer 91 and a receiver wafer 92 of materials with different thermal expansion coefficients are provided. With reference to FIG. 18b, the donor wafer 91 is implanted through its surface 93 with ions 96, creating a pre-determined zone of weakness 95 at or in the vicinity of a certain implantation depth d of the donor wafer 91.

Then, the implanted donor wafer 91 is annealed using a tempering device 90, as shown in FIG. 18c. This annealing step directly after the implanting step results in a weakening of the pre-determined detachment area 95 due to formation and growth of micro-cracks in the implanted region. The temperature used at that annealing step must be adjusted at a relatively low value to prevent the formation of surface blisters induced by ion implantation, which would prevent subsequent bonding of the donor substrate with a second substrate. Therefore, the weakening effect resulting from this annealing step is relatively minor.

As shown in FIG. 18d, the implanted and annealed donor wafer 91 is bonded with the receiver wafer 92 at the implanted surface 93 of the donor wafer 91 resulting in a heterogeneous wafer compound 99. This is followed by a second thermal treatment in a tempering device 90', as shown in FIG. 18e. The second thermal treatment causes further growth, overlapping and coalescence of the micro-cracks induced by ion-implantation, which detaches the wafer compound 99 at the pre-determined detachment area 95 when an energy corresponding to a budget of thermal detachment is reached for the respective compound.

The budget of thermal detachment is a certain thermal budget corresponding to the limit for thermal detachment or cleaving of a material, which is 100% of the necessary energy at which detachment occurs thermally. The used temperature-time-dependency of the budget of thermal detachment follows the Arrhenius Law in which the reciprocal of the annealing time is proportional to the exponent of the reciprocal of the annealing temperature. The budget of thermal detachment of heterogeneous bonded structures is dependent on a number of material, environmental and technological parameters like the kind of material, implantation conditions and bonding conditions.

The above described second thermal treatment must be carried out at relatively low temperature at which the bonded wafer pair suffers from degradation due to the different thermal expansion coefficients of the materials of the wafers 91, 92. This leads to an expanded annealing time for detachment of the wafer compound 99 to transfer a thin layer 97 of the donor wafer 91 to the receiver wafer 92.

In a further approach, U.S. Pat. No. 5,877,070 suggests an additional implantation step using a boron implantation to lower the detachment temperature. This method results in disadvantageous boron doping of the surrounding layers and is, especially due to the additional implantation step, expensive and time-consuming.

Another attempt, which has been presented for instance by Aspar et al. in the Proceedings of MRS, 1998, uses a high dose hydrogen implantation to facilitate detachment of a wafer of a heterogeneous wafer compound at the implanted area in an annealing step. However, this high dose ion implantation raises the cost of manufacture.

FR patent application 2,755,537 A describes a method to transfer a thin layer to a heterostructure in which an implanted substrate is thinned down after bonding of this substrate with another substrate to limit a sudden stress variation during thermal detachment causing indefinite breakage of the compound. This method causes an additional process step and results in a significant material consumption because the removed material is lost.

FR patent application 2,748,851 A discloses a method to detach a structure at lower temperatures using a combination of a heat treatment and mechanical efforts such as traction, shearing or bending forces. Such forces can be applied with a tool, a fluid or with another source of mechanical energy, for instance, as described in European patent application 0 977 242 A2, with a jet.

PCT publication WO 01/80308 A2 proposes an injection of energy pulses, such as laser pulses, into a structure with an embrittled zone to transfer a thin layer of silicon onto a $SiO_2$ substrate.

Thus, there is a need for manufacturing a wafer with an easy and effective detachment of a heterogeneous material compound at a reduced risk of an undefined breaking of the compound, and this is now provided by the present invention.

SUMMARY OF THE INVENTION

The present invention now provides a method of manufacturing a wafer which comprises annealing a heterogeneous material compound that includes a donor substrate of a first material and having a thin layer extending from one face to a weakened zone, with the thin layer bonded to a receiver substrate of a second material that is different from the first material, the annealing being conducted at a temperature and for a time less than that sufficient to cause detachment of the thin layer from the donor substrate, and then irradiating the annealed heterogeneous material compound with photons to obtain detachment of the thin layer from the donor substrate along the weakened zone. Advantageously, the first material has a different coefficient of thermal expansion than that of the second material.

The annealing is performed at an energy of from about 70 up to about 99% of that of a budget of thermal detachment at which the thin layer will detach from the donor substrate. The photons are preferably applied with a wavelength that is absorbable by the thin layer or the donor substrate, with a preferred wavelength of the photons being in the ultraviolet region of the spectrum. The irradiation can be performed through the receiver or the donor substrate.

Other aspects, objects and advantages of the invention will be better understood on reading the following detailed description of an implementation explained below.

BRIEF DESCRIPTION OF THE DRAWINGS

Specific embodiments of the present invention will become more apparent from the following detailed description with reference to the accompanying drawings, in which.

DETAILED DESCRIPTION OF THE PREFERRED EMBODIMENTS

In accordance with one aspect of the invention, by annealing, the pre-determined detachment area of the heterogeneous material compound can be pre-fragilized thermally, yet not thermally detached at the detachment area. In this manner, a certain amount of thermal energy is already provided to this pre-determined detachment area as a result from annealing. Irradiation provides the additional amount of thermal energy needed to detach the heterogeneous material compound at the pre-determined and pre-fragilized detachment area in an easy but efficient way. It allows the localization of additional thermal energy at the pre-determined detachment area, whereby a risk of deformation due to annealing which could lead to damage or degradation of the heterogeneous material compound can be reduced. With irradiation it is possible to obtain detached parts of the heterogeneous material compound relatively quickly, with good quality and very low risk of an indefinite destruction or degradation of the heterogeneous material compound.

Since the annealing and irradiation are performed after the formation of the heterogeneous material compound, they can be very easily combined and adjusted to each other, resulting in reduced wafer handling and increased efficiency of the process.

In accordance with another exemplary embodiment of the invention, the annealing is performed at an energy of up to about 99%, and preferably between about 70% to 99%, of an energy of a budget of thermal detachment at which the heterogeneous material compound can detach. This way, during annealing, an optimum amount of energy can be applied to the heterogeneous material compound to pre-fragilize the heterogeneous material compound. Therefore, the irradiation that follows must only apply a relatively small amount of energy to the heterogeneous material compound to make it possible that the heterogeneous material compound can be detached very quickly and in an efficient manner.

In accordance with another aspect of the invention, the photons can be applied with a wavelength absorbable by at least one material in the heterogeneous material compound. This allows heat formation in the heterogeneous material compound during irradiation, which can be used for selective local heating of the pre-determined detachment area for a short time to provide a thermal energy for detachment and to minimise a risk of deformation of the heterogeneous material compound.

In accordance with still another aspect of the invention, irradiation is performed through a receiver substrate, the receiver substrate being a part of the heterogeneous material compound and serving to receive a part of a donor material of the compound in which the pre-determined detachment area is formed. In accordance with this aspect of the invention, photons can go through the receiver substrate and can then be absorbed in the donor substrate, leading to a direct heating of the pre-determined detachment area for detachment.

In accordance with a further aspect of the invention, the irradiation is performed through a donor substrate, the donor substrate being a part of the heterogeneous material compound, in which the pre-determined detachment area is formed. In further accordance with this aspect of the invention, the photons can go through the donor substrate and can be absorbed in another part of the heterogeneous material compound next to the donor substrate, such as a receiver substrate, to heat up the pre-determined detachment area in the donor substrate indirectly; via conduction.

In accordance with a further aspect of the invention, a heat sink is applied proximal to the heterogeneous material compound. The heat sink material is preferably applied to the portion of the heterogeneous material compound having the highest thermal expansion coefficient. In accordance with this aspect of the invention, it is possible to ensure that the material with the higher thermal expansion coefficient heats up only to a level below a threshold temperature above which the heterogeneous material compound could be damaged in an undefined manner.

In accordance with another aspect of the invention, the annealing includes an irradiation of the heterogeneous material compound with photons. This permits efficient heating of the heterogeneous material compound during annealing, leading to a good pre-weakening effect at the pre-determined detachment area.

In accordance with a further aspect of the invention, the annealing and irradiation are performed with the same device. This method reduces the handling requirements for detachment of the heterogeneous material compound and can shorten the necessary processing time.

In accordance with still another aspect of the invention, the photons are selected from a group consisting of non-coherent light and laser light. This makes it possible to get a good energy supply to the heterogeneous material compound wherein a broad variety of light sources can be used.

According to another exemplary embodiment of the invention, the irradiation is provided two-dimensionally over a surface of the heterogeneous material compound. This ensures a substantially uniform energy supply to the whole heterogeneous material compound in a relatively short time. Furthermore, with this method it is possible to obtain a homogeneous heating up of the heterogeneous material compound, resulting in a uniform detachment of the pre-determined detachment area upon such irradiation.

According to a further embodiment of the invention, the photons are scanned over the heterogeneous material compound. This method allows a continuous heating up of the heterogeneous material compound which can cause a gradual expansion of a detachment front at the pre-determined detachment area in the heterogeneous material compound, leading to very good detachment results.

In accordance with a further aspect of the invention, the irradiation includes applying a thermal shock to the heterogeneous material compound to induce detachment. The thermal shock provides both thermal and mechanical energy to initiate a crack propagation along the pre-determined detachment area, causing a very quick but very well-defined detachment of the heterogeneous material compound. The thermal shock can be applied to influence thermally only the material region of the pre-determined detachment area so that the residual part of the heterogeneous material compound remains unimpaired.

According to a further advantageous variant of the invention, the heterogeneous material compound is cooled down to a room temperature of about 18° C. to 25° C. between annealing and irradiation. This has the advantage that the temperature of the heterogeneous material compound only increases locally at the pre-determined detachment line, whereas the temperature of the overall structure is maintained at room temperature. This aids in preventing any undefined breaking or formation of other defects in the heterogeneous material compound.

According to still another aspect of the invention, the irradiation is performed during a period in which the heterogeneous material compound cools down from the temperature of the annealing to a room temperature, and in which the heterogeneous material compound has a temperature below a threshold temperature above which undefined damage of the heterogeneous material compound can occur. This method makes it possible to detach the heterogeneous material compound in a defined way within a reduced process time.

It is furthermore advantageous to perform the irradiation with a Xenon lamp and/or a Halogen lamp. With a Xenon lamp and/or a Halogen lamp, photons with a short wavelength such as a blue or UV-irradiation can be applied to the heterogeneous material compound, which is especially of interest when at least one of the compound materials is transparent to that wavelength, while another heterogeneous material compound material can absorb these photons. This permits selective heating of locally defined regions of the heterogeneous material compound.

According to a specific embodiment of the invention, a selective wavelength or spectrum of wavelengths is applied by using an irradiation filter. With the filter, a specific wavelength or spectrum, being advantageous for an effective treatment of the wafer, can be applied.

The photons may be pulsed as they are applied to the heterogeneous material compound for greater effect. The photons may be applied to an edge portion of the heterogeneous material compound, to a center portion of the heterogeneous material compound, or to the entire heterogeneous material compound, as desired.

Figure 1:
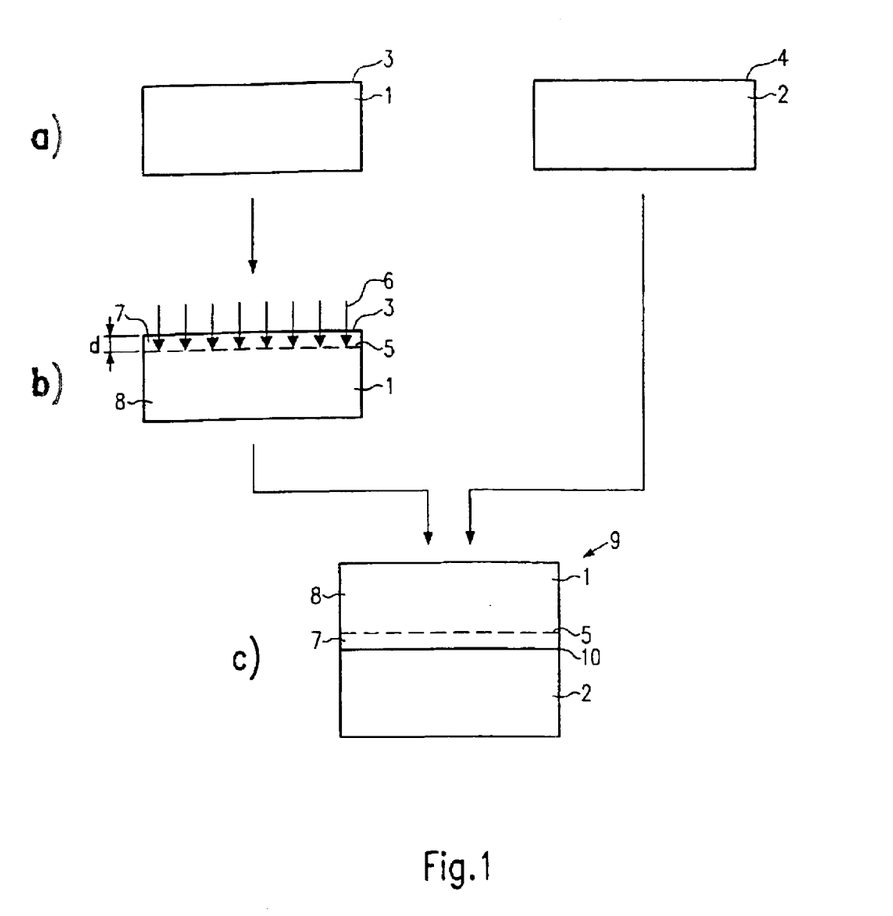
FIGS. 1(a)–1(c) schematically shows typical steps before a detachment of the heterogeneous material compound according to an exemplary embodiment of the present invention.

In accordance with the invention and as depicted in FIGS. 1(a)–1(c), for purposes of illustration and not limitation, a method in accordance with the present invention is provided. FIGS. 1(a)–1(c) schematically show initial steps for preparing a heterogeneous material compound 9. As shown in FIG. 1a, two substrates 1, 2 with different thermal expansion coefficients, are used. The substrates 1, 2 are preferably wafers but can be of any kind of substrate, such as layers, platelets, chips, compounds, etc. In principle, any kind of material can be used for substrates 1, 2; preferably the substrates 1, 2 are of silicon, silicon oxide, synthetic quartz and/or fused silica, silicon carbide, $A_{III}$-$B_V$ semiconductors, such as gallium nitride, gallium arsenide or indium phosphide, SiGe, diamant, sapphire and/or silicon nitride. The substrates 1, 2 have surfaces 3, 4.

With reference to FIG. 1b, the substrate 1 is implanted through the surface 3 with ions or ion clusters, such as hydrogen ions 6. The implanted ions 6 form a maximum ion concentration in the substrate 1 at or in the vicinity of a certain depth d, around which a pre-determined detachment area 5 is formed.

The pre-determined detachment area 5 divides the substrate 1 into a thin region 7 above this area 5 and a residual part 8 below this area S.

As shown in FIG. 1c, the implanted substrate 1 and the substrate 2 are bonded together at a bonding interface 10, forming a heterogeneous material compound 9. The bonding is accomplished in such a way that the thin region 7 of the donor substrate 1 is bonded with the receiver substrate 2.

Figure 2:
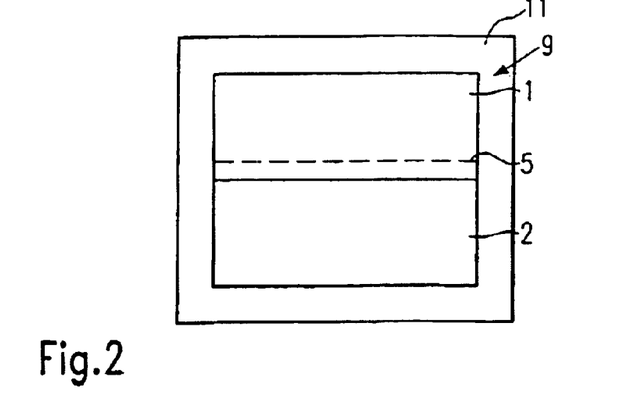
FIG. 2 schematically shows an annealing step of a method according to an exemplary embodiment of the present invention.

For purposes of illustration and not limitation, as depicted herein, FIG. 2 schematically shows an annealing step of a method according to an exemplary embodiment of the present invention. In the annealing step, the heterogeneous material compound 9 of FIG. 1c is tempered in a furnace 11 or another tempering device to weaken the pre-determined detachment area 5. During the annealing step, a degree of energy is applied to the heterogeneous material compound 9 which corresponds to an energy of up to 99%, preferably about 70% to 99% of a budget of thermal detachment at which detachment of the heterogeneous material compound 9 occurs thermally.

The amount of energy applied is dependent on a number of material, environmental and technological parameters, like the kind of materials used, implantation conditions, and bonding conditions of the respective heterogeneous material compound.

In accordance with another aspect of the present invention, the annealing step can be performed with an irradiation of the compound 9.

The supply of energy to the heterogeneous material compound 9 during the above annealing step leads to a weakening of the structure at the pre-determined detachment area 5. This effect is independent of whether thermal energy is supplied by a furnace or an irradiation. The microcavities induced by ion-implantation are activated by the thermal energy and grow. The annealing step is stopped before a detachment of the compound.

For purposes of illustration and not limitation, as depicted herein, FIGS. 3 to 10 schematically show irradiation steps and temperature profiles according to several exemplary embodiments of the present invention. In each case, the irradiation step provides, at a minimum, the additional amount of thermal energy to the structure necessary to detach the respective compounds at pre-determined detachment area 5. The irradiation step provides a local heating of the pre-determined detachment area 5. The local heating activates the pre-determined detachment area 5, so that the risk of deformation due to annealing which could lead to damage of the compound will be reduced.

Figure 3:
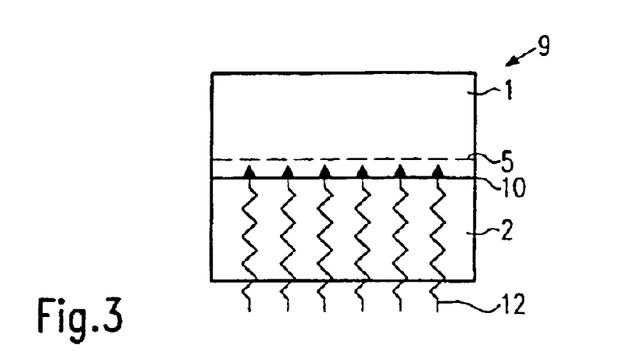
FIG. 3 shows an irradiation step of a method according to a first exemplary embodiment of the present invention.

For purposes of illustration and not limitation, as depicted herein, FIG. 3 schematically shows an irradiation step according to a first exemplary embodiment of the present invention which can be applied to the pre-annealed heterogeneous material compound 9 of FIG. 2. In that irradiation step, photons 12 are irradiated through the receiver substrate 2 which is transparent to the irradiation. The photons 12 are absorbed within a few microns in the donor substrate 1. By this method, the region at and/or near the pre-determined detachment area 5 can be heated up directly, due to the direct thermal heating of the donor substrate 1.

Figure 4:
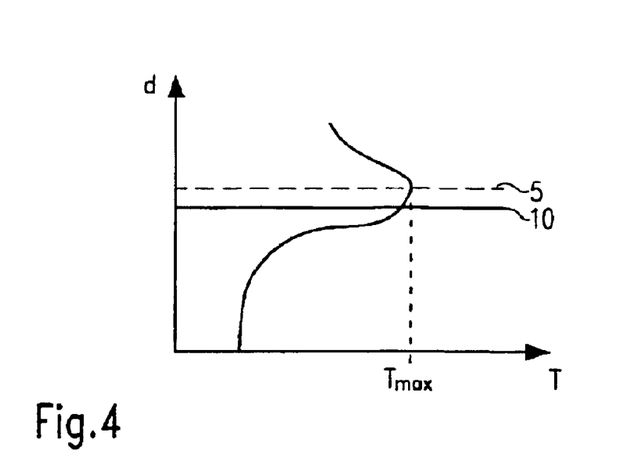
FIG. 4 schematically shows a temperature profile of the structure depicted in FIG. 3.

FIG. 4 schematically shows the temperature profile of the structure shown in FIG. 3, in which the temperature T is shown versus a thickness d of the heterostructure during the irradiation, according to the first exemplary embodiment. A maximum temperature $T_{max}$ of the structure is achieved at and/or near the pre-determined detachment area 5, whereas the temperature gradually decreases starting from this pre-determined detachment area 5 to the outer surfaces of the heterogeneous material compound 9.

Figure 5:
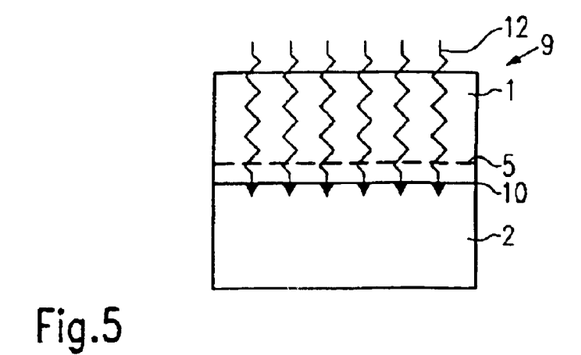
FIG. 5 schematically shows an irradiation step of a method according to a second exemplary embodiment of the present invention.

For purposes of illustration and not limitation, as depicted herein, FIG. 5 schematically shows an irradiation step according to a second exemplary embodiment of the present invention which can be applied to the pre-annealed heterogeneous material compound 9 as shown in FIG. 2. In accordance with this exemplary embodiment of the invention, the photons 12 go through the donor substrate 1 and are absorbed within a few microns in the receiver substrate 2, heating up this area. Then, the implanted pre-determined detachment area 5 in the donor substrate 1 is indirectly heated up via conduction.

Figure 6:
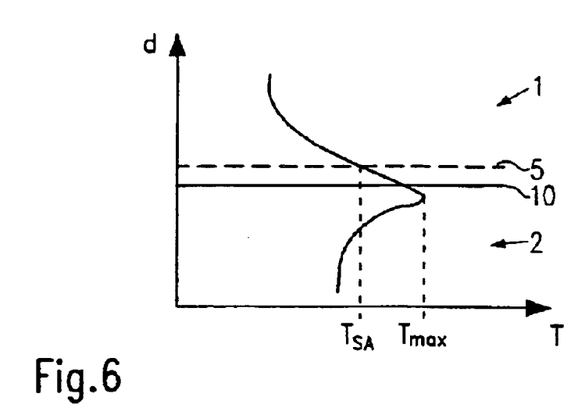
FIG. 6 schematically shows a temperature profile of the structure depicted in FIG. 5.

For purposes of illustration and not limitation, as depicted herein, FIG. 6 schematically shows a temperature distribution in the structure depicted in FIG. 5, wherein the temperature T is plotted versus a thickness d of the heterostructure, during the irradiation step in accordance with this second exemplary embodiment of the invention. A maximum temperature $T_{max}$ of the structure is achieved in the receiver substrate 2 near the interface 10 between the donor substrate 1 and the receiver substrate 2. The region with the maximum temperature $T_{max}$ indirectly heats up the pre-determined detachment area 5 over the interface 10 resulting in an increased temperature $T_{sa}$ at the pre-determined detachment area 5.

Figure 7:
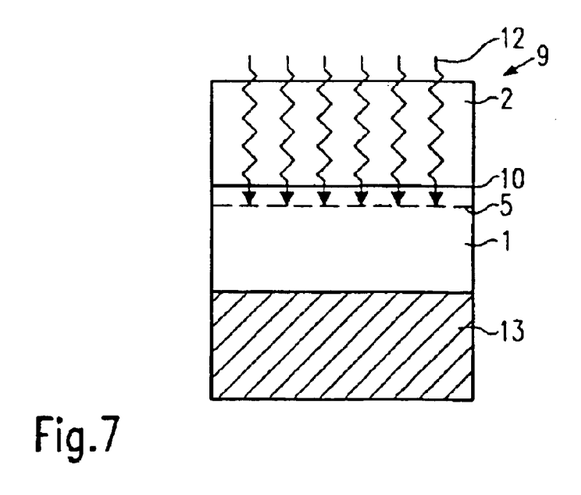
FIG. 7 schematically shows an irradiation of a method according to a third exemplary embodiment of the present invention.

For purposes of illustration and not limitation, as depicted herein, FIG. 7 schematically shows a method according to a third exemplary embodiment of the present invention. On a back side of the donor substrate 1, a heat sink 13 is applied. This heat sink 13 can be any cooling device which is able to cool the donor substrate 1. In accordance with this exemplary embodiment, the photons 12 go through the receiver substrate 2 and are absorbed at the pre-determined detachment area 5 in the donor wafer 1. In the exemplary embodiment shown, the donor wafer 1 has a higher thermal expansion coefficient than the receiver substrate 2. Due to the cooling effect of the heat sink 13, the donor substrate 1 does not heat up above a threshold temperature $T_{Thr}$ above which the structure would break in an undefined manner.

Figure 8:
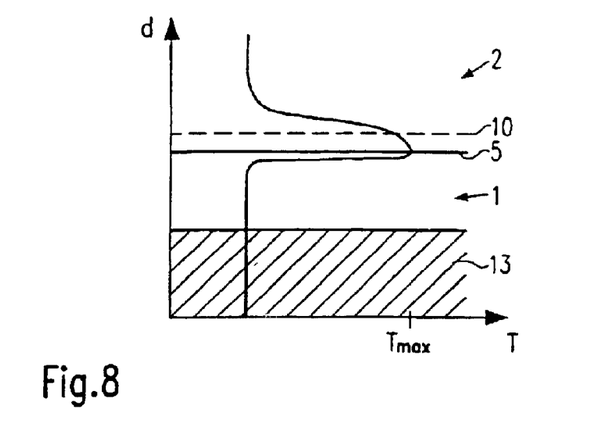
FIG. 8 schematically shows a temperature profile of the structure depicted in FIG. 7.

For purposes of illustration and not limitation, as depicted herein, FIG. 8 schematically shows a temperature distribution in the structure shown in FIG. 7, in which the temperature T is plotted versus the thickness d of the heterostructure, during the irradiation of the third exemplary embodiment. As already mentioned with reference to the first exemplary embodiment of the present invention shown in FIG. 3, a maximum temperature $T_{max}$ is reached by the exemplary method depicted in FIG. 7 at the pre-determined detachment area 5 in the donor substrate 1. The heat sink 13 which is applied on the back side of the donor substrate 1 prevents a heating up of the whole donor substrate 1, so that the heated up area is concentrated on the region at and near the pre-determined detachment area 5 in the donor substrate 1. This results in a very effective weakening at the pre-determined detachment area, whereas the residual part of the donor substrate 1 is not heated up above a critical threshold temperature $T_{Thr}$ at which the structure would break in an undefined manner.

Figure 9:
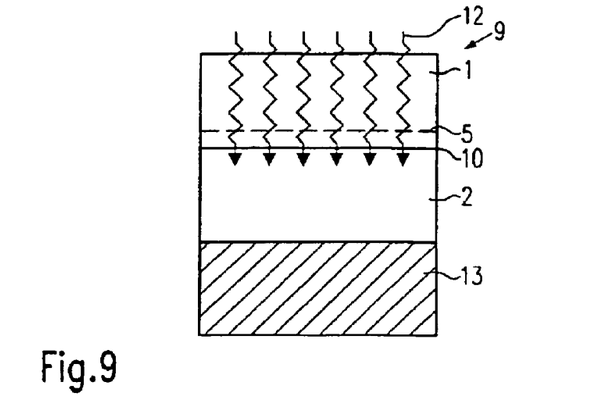
FIG. 9 schematically shows an irradiation of a method according to a fourth exemplary embodiment of the present invention.

For purposes of illustration and not limitation, as depicted herein, FIG. 9 schematically shows a fourth exemplary embodiment of the present invention. In this embodiment, the receiver substrate 2 has a higher thermal expansion coefficient in comparison to the donor substrate 1. In this case, a heat sink 13 is applied on the back side of the receiver substrate 2. The photons 12 go through the donor substrate 1 and are absorbed within a few microns of the receiver substrate 2, heating up this area. This leads to an indirect heating up of the pre-determined detachment area 5 in the donor substrate by the heated-up area next to the interface 10 between the receiver substrate 2 and the donor substrate 1.

Figure 10:
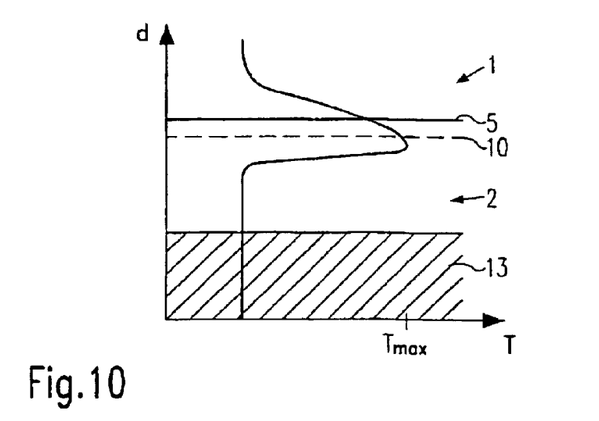
FIG. 10 schematically shows a temperature profile of the structure depicted in FIG. 9.

As depicted in FIG. 10, where a temperature distribution T versus the thickness d of the structure shown in FIG. 9 is given, the heat sink 13 prevents the heating up of the whole receiver substrate 2. This results in a heat concentration of the area near the interface 10, so that a maximum temperature $T_{max}$ is achieved within a few microns in the receiver substrate 2, causing an indirect heating of the pre-determined detachment area 5 in the donor substrate 1.

Figure 11:
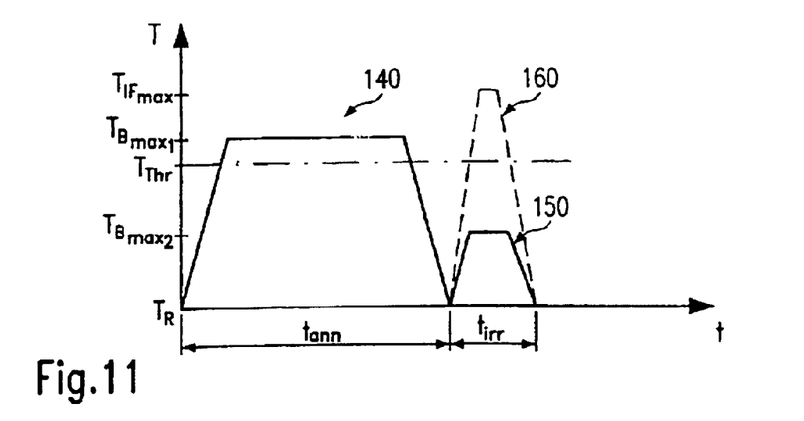
FIG. 11 schematically shows a temperature-time diagram of a method according to a fifth exemplary embodiment of the present invention.

For purposes of illustration and not limitation, as depicted herein, FIG. 11 schematically shows a fifth exemplary embodiment of the present invention. The method includes an annealing step 140 and an irradiation step 150, 160. In the annealing step, a heterogeneous material compound such as the structure 9 shown in FIG. 1c is annealed, for instance in a furnace or another tempering device, for an annealing time $t_{ann}$. In this step, the temperature T is increased in a relatively short time from a room temperature $T_R$ to a temperature $T_{Bmax1}$ which is slightly above a threshold temperature $T_{Thr}$. Then, the structure 9 is held at the elevated temperature $T_{Bmax1}$ and is decreased after a period of time again to room temperature $T_R$. The annealing step 140 provides an energy of up to 99%, preferably about 70% to 99% of the energy of a budget of thermal detachment to the compound 9, leading to a pre-weakening of the pre-determined detachment area 5 of the heterogeneous material compound 9.

Subsequent to the annealing step 140, an irradiation step 150, 160 is applied to the heterogeneous material compound 9. The irradiation step can be performed in the same device as the annealing step or in another device 140. The irradiation step 150, 160 can be applied over the whole heterogeneous material compound 9 in two-dimensions. This leads to a complete and uniform heating of the whole compound 9 at one time. In accordance with another exemplary embodiment of the invention, the irradiation can be performed by a scanning over the compound. Thus, a gradual heating up of the compound 9 can be achieved.

For purposes of the irradiation step, any kind of light source such as non-coherent light or laser light can be used. In the exemplary embodiment shown, a Xenon lamp is used, whereas in another exemplary embodiment a Halogen lamp can be used. Blue or UV-light is advantageous.

For purposes of illustration and not limitation, as depicted herein in FIG. 11, the irradiation results in different temperature-time courses 150, 160, in the heterogeneous material compound 9. The temperature-time course 150 is achieved in a bulk material of the heterogeneous material compound 9, which is far from the interface 10 between the donor substrate 1 and the receiver substrate 2. The maximum temperature $T_{Bmax2}$ of this bulk material is much lower than the critical threshold temperature $T_{Thr}$ at which the heterogeneous material compound 9 could break in an undefined manner.

As shown by the temperature-time course 160, only a region near the interface 10 between the donor substrate 1 and the receiver substrate 2 is heated above the threshold temperature $T_{Thr}$. This leads to a supply of the residual amount of energy necessary for thermal detachment, resulting in a further weakening of the pre-determined detachment area 5 of the heterogeneous material compound 9, finally causing an accurate detachment of the heterogeneous material compound 9 at this pre-determined detachment area 5.

Figure 12:
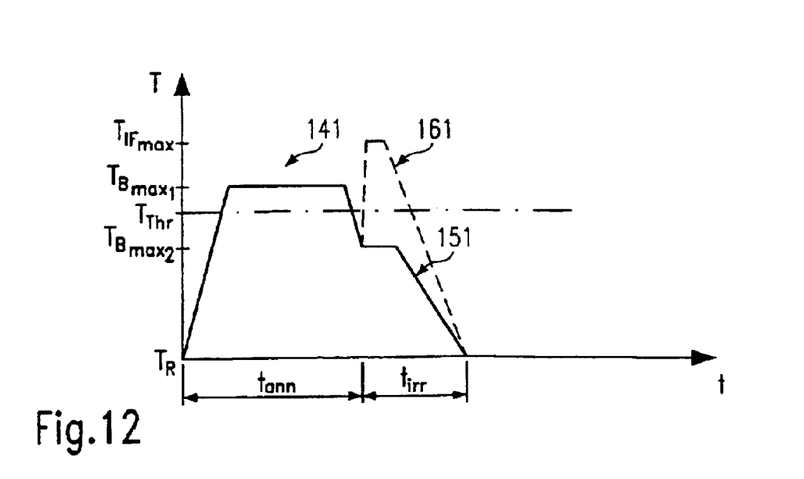
FIG. 12 schematically shows a temperature-time diagram of a method according to a sixth exemplary embodiment of the present invention.

For purposes of illustration and not limitation, as depicted herein, FIG. 12 schematically shows a temperature-time course of a method according to a sixth exemplary embodiment of the present invention. In this method, a heterogeneous material compound such as the structure 9 shown in FIG. 1c is heated up from a room temperature $T_R$ in a relatively short time to a temperature $T_{Bmax1}$ which is slightly above a critical threshold temperature $T_{Thr}$. Then, the structure 9 is held at this temperature $T_{Bmax1}$ for a certain time and is subsequently further decreased to a temperature $T_{Bmax2}$ which is below the threshold temperature $T_{Thr}$. At the temperature $T_{Bmax2}$ which is reached after an annealing time $t_{ann}$, the heterogeneous material compound 9 is irradiated with photons 12 in a similar way to that described with reference to FIG. 11 herein. The photons cause the temperature-time course 161 at the interface 10 of the heterogeneous material compound 9 and the temperature-time course 151 in a bulk material of the heterogeneous material compound 9.

As shown by the temperature-time course 161, the area near the interface 10 of the heterogeneous material compound 9 heats up to a temperature $T_{1Pmax}$ which is higher than the threshold temperature $T_{Thr}$. This heating of the interface is performed in a relatively short time $t_{irr}$. In this time, $t_{irr}$, the bulk material of the heterogeneous material compound 9 only heats up to a temperature $T_{Bmax2}$ which is lower than the threshold temperature $T_{Thr}$, preventing an undefined damaging of the heterogeneous material compound 9 during the irradiation step 151, 161.

Figure 13:
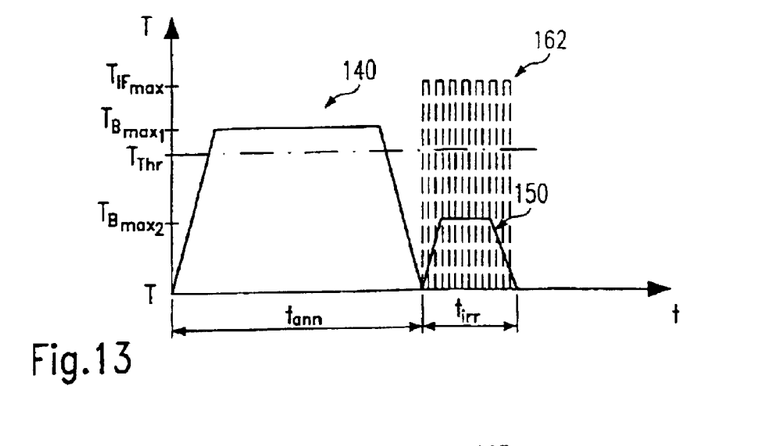
FIG. 13 schematically shows a temperature-time diagram of a method according to a seventh exemplary embodiment of the present invention.

For purposes of illustration and not limitation, as depicted herein, FIG. 13 schematically shows a method according to a seventh exemplary embodiment of the present invention. In accordance with this aspect of the invention, a heterogeneous material compound such as structure 9 of FIG. 1c undergoes an annealing step 140 which is similar to the annealing step shown and described with reference to FIG. 11. After the annealing step 140 there follows an irradiation step 150, 162 for an irradiation time $t_{irr}$. The structure 9 is irradiated with photonic pulses 162, each of which induces a temperature $T_{1Pmax}$ at the interface 10 between the donor substrate 1 and the receiver substrate 2. These photonic pulses cause only a slight heating up of the bulk material of the heterogeneous material compound 9, as shown by the temperature-time course 150 of FIG. 13. The bulk material reaches a temperature $T_{Bmax2}$ which is much lower than the threshold temperature $T_{Thr}$ at which the heterogeneous material compound could break in an undefined manner. The photonic pulses 162 cause a favorable weakening of the pre-determined detachment area 5, leading to a good detachment at this area 5.

Figure 14:
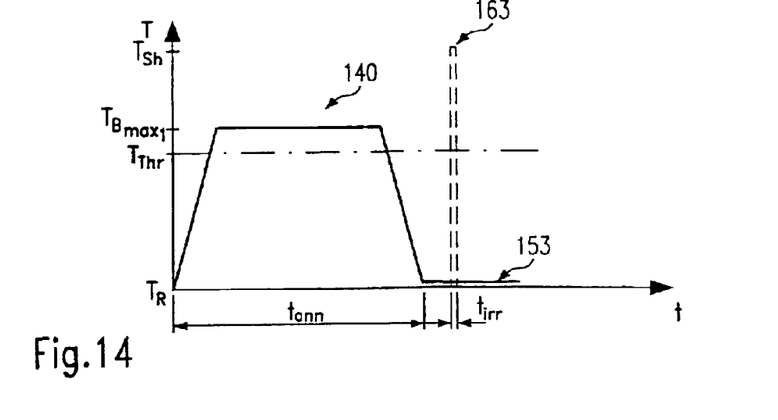
FIG. 14 schematically shows a temperature-time diagram of a method according to an eighth exemplary embodiment of the present invention.

For purposes of illustration and not limitation, as depicted herein, FIG. 14 schematically shows a method according to an eighth exemplary embodiment of the present invention. First, an annealing step 140 is performed which is similar to the annealing step shown and described with reference to FIGS. 11 and 13. In this annealing step, the pre-determined detachment area 5 is pre-weakened at an energy of up to 99%, preferably at about 70% to 99% of a budget of thermal detachment at which the heterogeneous material compound 9 can detach. The further percentage of energy necessary for detachment is applied in the following irradiation step 163. Therein, a photonic pulse 163 with a relatively high intensity is performed in a relatively short time $t_{irr}$, leading to a thermal shock of the compound 9. By the pulse 163, only a region at and/or near the pre-determined detachment area 5 heats up to a temperature $T_{sh}$. The residual bulk material of the heterogeneous material compound 9 remains at room temperature $T_R$ so that the damaging of the heterogeneous material compound 9 in an undefined manner is prevented. The photonic pulse 163 results in a sufficient weakening of the pre-determined detachment area, causing a good detachment of the structure 9 along this pre-determined detachment area 5.

Figure 15:
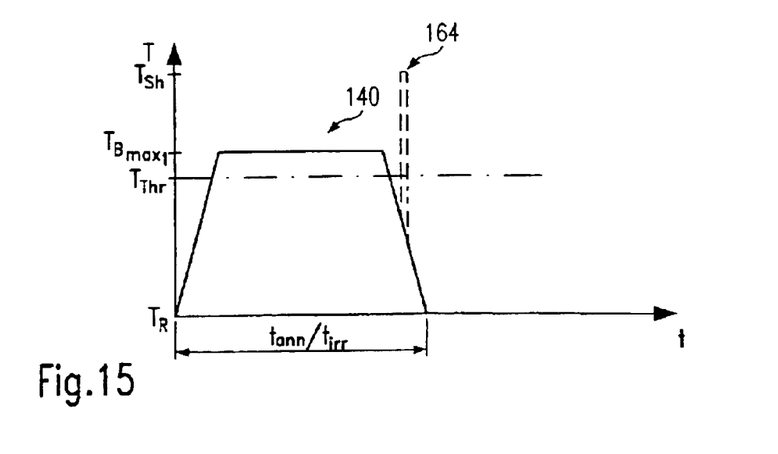
FIG. 15 schematically shows a temperature-time diagram of a method according to a ninth exemplary embodiment of the present invention.

For purposes of illustration and not limitation, as depicted herein, FIG. 15 schematically shows a method according to a ninth exemplary embodiment of the present invention. This exemplary method involves first applying an annealing step 140 to a heterogeneous material compound such as the structure 9 of FIG. 1c, which is similar to the annealing step 140 shown and described with reference to FIGS. 11, 13 and 14. At the end of this annealing step 140, the heterogeneous material compound 9 is irradiated with photons 164 in a similar way to that described with reference to FIG. 11 or as a photonic pulse or pulses. The irradiation is started during cooling of the heterogeneous material compound 9 in the annealing step, at a temperature at which the heterogeneous material compound 9 below a critical threshold temperature $T_{Thr}$. During irradiation, only a region at and/or near the interface 10 between the donor substrate 1 and the receiver substrate 2 is heated up to a relatively high temperature $T_{sh}$ which is much higher than the threshold temperature $T_{Thr}$. The residual part of the heterogeneous material compound does not heat up above this threshold temperature $T_{Thr}$. At the end of this combined annealing and irradiation, 100% of the necessary energy corresponding to 100% of the budget of thermal detachment is reached, resulting in a high quality detachment of the heterogeneous material compound 9 at the pre-determined detachment area 5.

Figure 16:
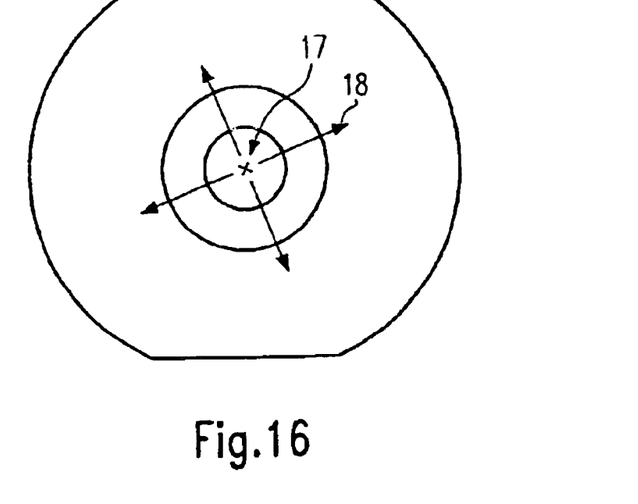
FIG. 16 schematically shows a crack propagation in a heterogeneous material compound upon a thermal shock at a centre of the compound.
Figure 17:
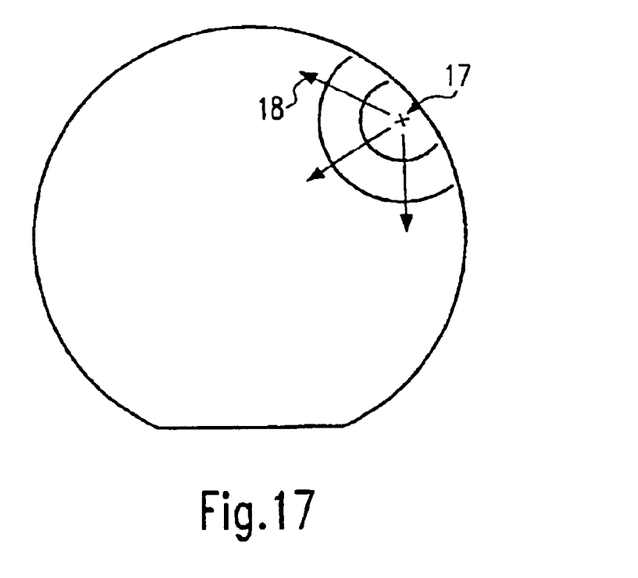
FIG. 17 schematically shows a crack propagation in a heterogeneous material compound upon a thermal shock at an edge of the compound.

For purposes of illustration and not limitation, as depicted in FIGS. 16 and 17, the photonic treatments or shocks shown in FIGS. 14 and 15 can be applied locally, for instance at the center of the substrate, as shown in FIG. 16, or at an edge of a substrate as shown in FIG. 17. In another exemplary embodiment of the invention, a thermal shock can be applied over the whole material compound. The duration and the energy of the applied thermal shocks depends on the properties of the material used in the heterogeneous material compound 9.

The thermal shock provides both thermal and mechanical energy in initiating crack propagation through the pre-determined detachment area 5. Such thermal shocks have the advantage that they can be well-assimilated by the pre-determined detachment area 5. By using the thermal shock, a part of the heterogeneous material compound with a higher thermal expansion coefficient can be maintained at a relatively low temperature, wherein the pre-determined detachment area heats up and leads to a good detachment, whereas the residual part of the material compound is not damaged.

It will be apparent to those skilled in the art that various modifications and variations can be made in the present invention without departing from the spirit or scope of the invention. Thus, it is intended that the present invention include all such modifications and variations within the scope of the appended claims and their equivalents.

What is claimed is:

1. A method of manufacturing a wafer which comprises:
annealing a bonded heterogeneous material compound that includes a donor substrate of a first material and having a thin layer extending from one face to a weakened zone, with the thin layer bonded to a receiver substrate of a second material that is different from the first material, the annealing conducted at a temperature and for a time less than that sufficient to cause detachment of the thin layer from the donor substrate; and
irradiating the annealed heterogeneous material compound with photons to obtain detachment of the thin layer from the donor substrate along the weakened zone.

2. The method of claim 1, wherein the annealing is performed at an energy of up to about 99% of that of a budget of thermal detachment at which the thin layer will detach from the donor substrate.

3. The method of claim 1, wherein the annealing is performed at an energy of about 70% to 99% of that of a budget of thermal detachment at which the thin layer will detach from the substrate.

4. The method of claim 1, wherein the photons are applied with a wavelength that is absorbable by the donor substrate or the receiver substrate.

5. The method of claim 4, wherein the wavelength of the photons is in the ultraviolet region of the spectrum.

6. The method of claim 1, wherein the irradiation is performed through the receiver substrate.

7. The method of claim 1 wherein the irradiation is performed through the donor substrate.

8. The method of claim 1, wherein the first material has a different coefficient of thermal expansion compared to the second material.

9. The method of claim 1, which further comprises applying a heat sink proximal to a portion of the heterogeneous material compound, the heat sink being applied to the substrate having the higher thermal expansion coefficient.

10. The method of claim 1 wherein the annealing and the irradiation are performed with the same device.

11. The method of claim 1 wherein the photons are selected from the group consisting of non-coherent light and laser light.

12. The method of claim 1 wherein the irradiation is provided two-dimensionally over a surface of the heterogeneous material compound.

13. The method of claim 1 wherein the photons are scanned over the heterogeneous material compound.

14. The method of claim 1 wherein the irradiation includes applying a thermal shock to the heterogeneous material compound to induce detachment.

15. The method of claim 1 wherein the heterogeneous material compound is cooled down to a temperature of about 18° C. to 25° C. between the annealing and the irradiation.

16. The method of claim 15 wherein the irradiation is performed while the heterogeneous material compound is cooled or after the heterogeneous material compound has been cooled to a temperature below a threshold temperature ($T_{Thr}$), wherein an undefined damage of the heterogeneous material compound can occur at the threshold temperature.

17. The method of claim 16, wherein the irradiation is performed with a Xenon lamp.

18. The method of claim 16, wherein the irradiation is performed with a Halogen lamp.

19. The method of claim 1, wherein a selective wavelength is applied by using an irradiation filter during the irradiation.

20. The method of claim 1, wherein a spectrum of wavelengths is applied by using an irradiation filter during the irradiation.

21. The method of claim 1, wherein the photons are pulsed as they are applied to the heterogeneous material compound.

22. The method of claim 1, wherein the photons are applied to an edge portion of the heterogeneous material compound.

23. The method of claim 1, wherein the photons are applied to a center portion of the heterogeneous material compound.

24. The method of claim 1, wherein the photons are applied to the entire heterogeneous material compound.

* * * * *